United States Patent [19]

Joswig

[11] Patent Number: 5,128,009
[45] Date of Patent: Jul. 7, 1992

[54] PROCESS FOR REDUCING THE REFLECTIVITY OF SPUTTERED FILMS

[75] Inventor: Hellmut Joswig, München, Fed. Rep. of Germany

[73] Assignee: Siemens Aktiengesellschaft, Munich, Fed. Rep. of Germany

[21] Appl. No.: 621,033

[22] Filed: Nov. 30, 1990

[30] Foreign Application Priority Data

Nov. 30, 1989 [DE] Fed. Rep. of Germany ....... 3939636

[51] Int. Cl.$^5$ ................... C23C 14/34; C23C 14/54
[52] U.S. Cl. ........................... 204/192.27; 204/192.26
[58] Field of Search ................. 204/192.12, 192.15, 204/192.26, 192.27

[56] References Cited

U.S. PATENT DOCUMENTS 4,125,446 11/1978 Hartsough et al. ............. 204/192.27
4,139,443 2/1979 Sakurai ........................... 204/192.29
4,657,648 4/1987 Nagarekawa et al. ......... 204/192.26

OTHER PUBLICATIONS

D. Widman et al., "Technologie hochintegrierter Schaltungen" (Technology of Highly Integrated Circuits), Sec. 3.9, p. 95, Springer-Verlag, Berlin 1988.

*Primary Examiner*—Aaron Weisstuch
*Attorney, Agent, or Firm*—Herbert L. Lerner; Laurence A. Greenberg

[57] ABSTRACT

A process for reducing the reflectivity of films which are produced by sputtering and are to be structured in semiconductor technology, especially a photographic technique, includes varying a process parameter at the end of the sputtering process resulting in a partial film mear the surface havaing reduced reflectivity while other properties of the film remain substantially the same.

5 Claims, No Drawings

PROCESS FOR REDUCING THE REFLECTIVITY OF SPUTTERED FILMS

The invention relates to a process for reducing the reflectivity of films which are produced by sputtering and are to be structured in semiconductor technology, especially by a photographic technique.

In semiconductor microelectronics, dimensionally accurate, replicable structuring of thin films becomes increasingly significant with increasing miniaturization. The photographic technique used in the sub-micron range with films having a reflective surface, presents a particular problem.

In a photographic process, when such films have high reflectivity, some of the photoresist, which intrinsically is not supposed to be exposed to light, is exposed nevertheless. That causes bleeding or nicking of the photoresist, and after etching such flaws are then present in a film that is to be structured. In metal films, electric short circuits of adjacent tracks or breaks in tracks may result.

Another problem with the photographic technique for reflective films is the formation of vertical waves in the photoresist and a resultant uneven exposure of the resist to light, thus causing fluctuations in the widths of lines.

The above-mentioned problems are particularly pertinent to the metal films used in microelectronics Such films include refractory metals, for instance, their silicides, and aluminum and aluminum alloys. As a rule, such metal films are all produced by sputtering.

In order to avoid the disadvantages associated with high reflectivity as described above, previous attempts have been directed to applying various kinds of anti-reflection films to the films to be structured. Among such films are stoichiometric and nonstoichiometric silicon nitride, amorphous silicon, TiW, V, TiN or spun-on films with absorbing photoresist, for example.

A typical process sequence in structuring a film by photographic techniques is as follows: First, the film to be structured is deposited; then an anti-reflection film is deposited onto it. Photoresist is then applied, exposed to light, and developed, and the film to be structured is etched, after which the resist and the anti-reflection film are removed, and the film, which is structured by the etching, undergoes post-treatments. The last two steps of applying the anti-reflection film and post-treatment of the structured film in some cases may be combined into one process step. The post-treatment of the structured film may, for instance, be tempering, as is performed for aluminum and aluminum alloys at approximately 400° to 500° C., or a high-temperature process of the kind used with silicides ("silicidation" at 600° to 1000° C.).

It is accordingly an object of the invention to provide a process for reducing the reflectivity of sputtered films, which overcomes the hereinafore-mentioned disadvantages of the heretofore-known methods of this general type and in which the additional effort and expense associated with an anti-reflection film are avoided.

With the foregoing and other objects in view there is provided, in accordance with the invention, a process for reducing the reflectivity of films which are produced by sputtering and are to be structured in semiconductor technology, especially a photographic technique, which comprises varying a process parameter at the end of the sputtering process resulting in a partial film near the surface having reduced reflectivity while other properties of the film remain substantially the same.

In accordance with another mode of the invention, there is provided a process which comprises carrying out the step of varying the process parameter by varying the sputtering atmosphere through the addition of a reactive substance.

In accordance with a further mode of the invention, there is provided a process which comprises carrying out the step of adding the reactive substance by adding a foreign gas, in particular nitrogen or oxygen.

In accordance with a concomitant mode of the invention, there is provided a process which comprises carrying out the step of varying the process parameter by varying, in particularly raising, the sputtering pressure.

Other features which are considered as characteristic for the invention are set forth in the appended claims.

Although the invention is described herein as embodied in a process for reducing the reflectivity of sputtered films, it is nevertheless not intended to be limited to the details given, since various modifications may be made therein without departing from the spirit of the invention and within the scope and range of equivalents of the claims.

The method of operation of the invention, however, together with additional objects and advantages thereof will be best understood from the description of specific embodiments when read in connection with the following examples.

Referring now in detail to an exemplary embodiment of the invention, it is seen that a process parameter to be varied in a sputtering process, in which a partial film being disposed near the surface of the sputtered film and having reduced reflectivity is produced, while the other properties of the film remain substantially the same, may be the sputtering atmosphere, which is varied by the addition of a reactive substance. The term "reactive" in this case refers to the fact that the additional substance is incorporated into the sputtered film. According to further feature of the invention, the reactive substance may be a foreign gas, in particular nitrogen or oxygen, which is added to the sputtering atmosphere.

By adding a foreign gas of this kind at the end of the sputtering process, the surface of the sputtered film is changed in such a way that a considerable reduction in the reflectivity of the film results. On the other hand, however, the film is only modified in a thin region at the surface, so that other film properties, such as the film resistance, essentially do not vary.

A typical process sequence for structuring a sputtered film of this kind is as follows: First, the film to be structured is deposited by sputtering; the addition of the foreign gas creates a partial film near the surface that has reduced reflectivity. Next, the application of photoresist, exposure to light, and development are performed, as well as etching in order to structure the sputter film; after that, the resist is removed again and the structured film is post-treated.

Accordingly, an advantage of the process according to the invention is that two process steps, namely deposition and removal of the anti-reflective film, can be dispensed with, resulting in an overall simplification of a production process and making it less expensive, because less equipment is needed.

In order to provide a further explanation of the advantages of the invention, a molybdenum silicide film produced by conventional sputtering and one produced by the process according to the invention will be compared with one another. Both films are produced in the same sputtering equipment, using the same sputtering target. As the sputtering atmosphere, initially there is an argon atmosphere; for the films produced by the process of the invention, a nitrogen additive is present at the end of the sputtering process. Typical process parameters for the film produced by the process according to the invention are a sputtering power of from 1 to 10 kW, a pressure of from 1 to 10 mTorr, a proportion of foreign gas of from 5 to 100% for the nitrogen, and a thickness of the partial film near the surface having the reduced reflectivity of from 7 to 30 nm.

Process parameters, in particular the type and proportion of nitrogen and the duration of the addition of nitrogen at the end of the sputtering process, can be optimized in view of the reduction in reflectivity at the desired wavelength.

For a wavelength of 436 nm, there is a reduction in reflectivity from 52 to 14% for the film produced according to the invention, as compared with the conventionally produced film. With this considerable change in reflectivity of a partial film near the surface, there is no essential change in the film resistance of the complete film.

The change in one process parameter of the sputtering process need not be solely a change in the sputtering atmosphere by the addition of a reactive substance. According to a further embodiment of the invention, it is instead possible to vary the sputtering pressure as a process parameter, in particular to raise it.

I claim:

1. Process for reducing the reflectivity of films which are produced by sputtering and are to be structured in semiconductor technology, which comprises varying a process parameter at the end of the sputtering process resulting in a partial film near the surface having reduced reflectivity while a film resistance of the film remains substantially the same.

2. Process according to claim 1, which comprises carrying out the step of varying the process parameter by varying the sputtering atmosphere through the addition of a reactive substance.

3. Process according to claim 2, which comprises carrying out the step of adding the reactive substance by adding a foreign gas.

4. Process according to claim 2, which comprises carrying out the step of adding the reactive substance by adding a foreign gas selected from the group consisting of nitrogen and oxygen.

5. Process for reducing the reflectivity of films which are produced by sputtering and are to be structured by a photographic technique, which comprises varying a process parameter at the end of the sputtering process resulting in a partial film near the surface having reduced reflectivity while a film resistance of the film remains substantially the same.

* * * * *